(12) United States Patent
Tsai et al.

(10) Patent No.: US 10,763,402 B2
(45) Date of Patent: Sep. 1, 2020

(54) LIGHT-EMITTING DIODE PACKAGE

(71) Applicant: Lextar Electronics Corporation, Hsinchu (TW)

(72) Inventors: Shang-Hsun Tsai, Hsinchu (TW); Li-Wei Liu, Miaoli County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 16/209,992

(22) Filed: Dec. 5, 2018

(65) Prior Publication Data

US 2019/0245121 A1 Aug. 8, 2019

(30) Foreign Application Priority Data

Feb. 8, 2018 (CN) .......................... 2018 1 0128340

(51) Int. Cl.
*H01L 33/50* (2010.01)
*H01L 25/075* (2006.01)
*H01L 33/62* (2010.01)
*H01L 33/60* (2010.01)

(52) U.S. Cl.
CPC ........ *H01L 33/505* (2013.01); *H01L 25/0753* (2013.01); *H01L 33/60* (2013.01); *H01L 33/62* (2013.01)

(58) Field of Classification Search
CPC ....... H01L 33/60; H01L 33/62; H01L 33/505; H01L 33/0753; H01L 2933/0041; H01L 33/56; H01L 25/0753
See application file for complete search history.

(56) References Cited

U.S. PATENT DOCUMENTS

2011/0291135 A1* 12/2011 Hsieh .................... H01L 33/641
257/98

FOREIGN PATENT DOCUMENTS

| CN | 201044522 Y | 4/2008 |
|---|---|---|
| CN | 105789144 A | 7/2016 |
| DE | 102013206139 A1 | 10/2014 |
| JP | 2015-41722 A | 3/2015 |
| JP | 2016-127052 A | 7/2016 |
| TW | I501431 B | 9/2015 |
| WO | 2010/143114 A1 | 12/2010 |
| WO | 2011/122529 A1 | 10/2011 |
| WO | 2014/081042 A1 | 5/2014 |

\* cited by examiner

*Primary Examiner* — Jasmine J Clark
(74) *Attorney, Agent, or Firm* — CKC & Partners Co., LLC

(57) ABSTRACT

A light-emitting diode package includes a substrate, at least one light-emitting chip, a light-reflective layer and a wave-length conversion fluorescent layer. The light-emitting chip is located on the substrate. The light-reflective layer is arranged around the light-emitting chip. The wave-length conversion fluorescent layer is located over the light-emitting chip, wherein the light-reflective layer is spaced from the fluorescent wave-length conversion layer by a groove that reaches two opposite sides of the light-emitting diode package.

8 Claims, 4 Drawing Sheets

LIGHT-EMITTING DIODE PACKAGE

CROSS-REFERENCE TO RELATED APPLICATION

This application claims priority to China Application Serial Number 201810128340.0, filed Feb. 8, 2018 which is herein incorporated by reference in its entirety.

BACKGROUND

Field of Invention

The present disclosure relates to a light-emitting diode package.

Description of Related Art

Some conventional light-emitting diode vehicle headlights may have a high luminous intensity per unit area, and the inorganic sintering technology is often used on the photoelectric conversion material, and the phosphor powders are made into a ceramic composite sheet in order to solve the thermal cracking problem of the silicone based fluorescent layer.

Although the ceramic phosphor sheet may solve the thermal cracking problem, other side effects are also accompanied. When a difference between CTEs (Coefficient of thermal expansion) of the ceramic phosphor sheet and the light-reflective material is too large, in the state of long-time lighting or excessive temperature difference, the light-reflective material may expand to press and damage the ceramic phosphor sheet, and the ceramic phosphor sheet is thus cracked to have its fluorescent powders peeled off, thereby causing a serious color halo phenomenon in the vehicle headlight.

SUMMARY

In one or more embodiments, a light-emitting diode package includes a substrate, at least one light-emitting chip, a light-reflective layer and a wave-length conversion fluorescent layer. The light-emitting chip is located on the substrate. The light-reflective layer is arranged around the light-emitting chip. The wave-length conversion fluorescent layer is located over the light-emitting chip, wherein the light-reflective layer is spaced from the fluorescent wave-length conversion layer by a groove that reaches two opposite sides of the light-emitting diode package.

In one or more embodiments, a thermal expansion coefficient of the light-reflective layer is different from that of the wave-length conversion fluorescent layer.

In one or more embodiments, the groove has a width ranging from 0.05 millimeter to 0.5 millimeter.

In one or more embodiments, the at least one groove comprises plural grooves formed between each edge of the wave-length conversion fluorescent layer and the light-reflective layer respectively.

In one or more embodiments, any immediately-adjacent two of the plural grooves are intersected at a corner of the wave-length conversion fluorescent layer.

In one or more embodiments, any opposite two of the plural grooves are in parallel with each other.

In one or more embodiments, the at least one light-emitting chip is electrically coupled to the substrate by a flip-chip manner.

In one or more embodiments, the at least one light-emitting chip is electrically coupled to the substrate by an electrical wire.

In one or more embodiments, at least part of the electrical wire is embedded in the light-reflective layer.

In one or more embodiments, a top surface of the wave-length conversion fluorescent layer is level with a top surface of the light-reflective layer.

In sum, the light-emitting diode package of the present invention utilizes a concave groove between the wave-length conversion fluorescent layer and the light-reflective layer to serve a buffer space to deal with the CTE difference between the wave-length conversion fluorescent layer and the light-reflective layer such that these two layers will not squeeze each other to cause damages to the package structure. A width of the concave groove may be controlled according to demands without affecting the light-emitting profile so as to simultaneously improve the luminous efficacy and weather resistance.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
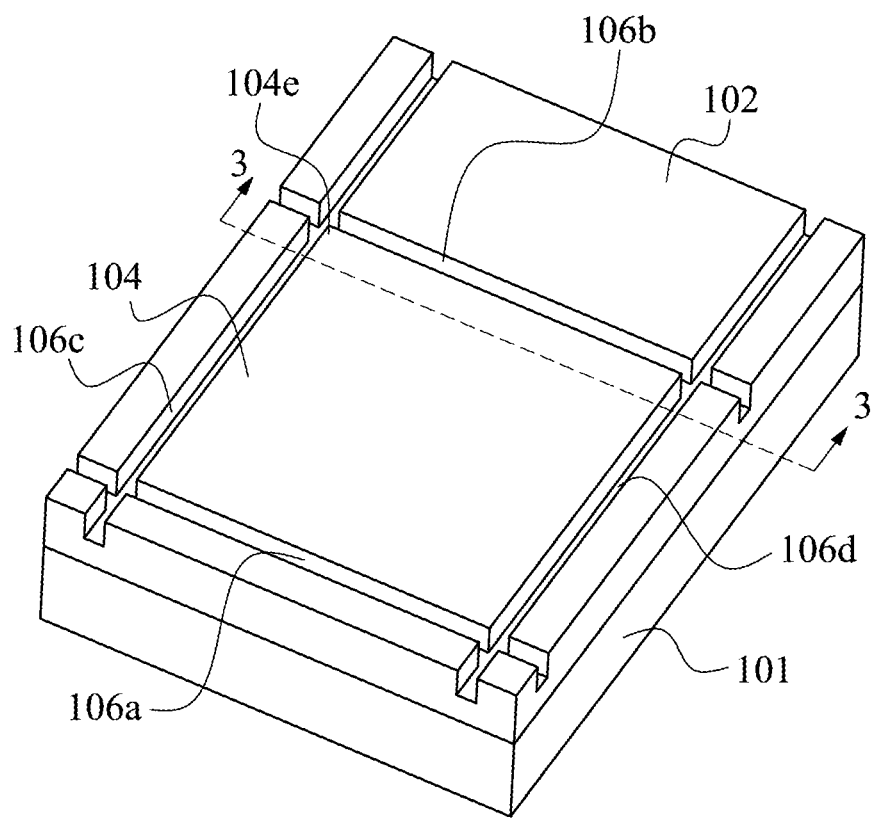
FIG. 1 illustrates a perspective view of a light-emitting diode package according to one embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

Reference is made to FIG. 1, which illustrates a perspective view of a light-emitting diode package according to one embodiment of the present disclosure. A light-emitting diode package 100a includes a substrate 101, at least one light-emitting chip 103 (referring to FIG. 3), a light-reflective layer 102 and a wave-length conversion fluorescent layer 104. The light-reflective layer 102 surrounds the light-emitting chip 103 and all edges of the wave-length conversion fluorescent layer 104. The wave-length conversion fluorescent layer 104 is located over the light-emitting chip 103, and configured to convert light emitted from the light-emitting chip 103 into light with different colors or wave-lengths. And, a concave groove is formed between the wave-length conversion fluorescent layer 104 and the light-reflective layer 102, to space these two layers from each other, and two ends of the concave groove may reach two opposite sides or edges of the light-emitting diode package 100a respectively.

In this embodiment, the concave grooves (106a, 106b, 106c, 106d) are formed between each edge of the wave-length conversion fluorescent layer 104 and the surrounding light-reflective layer 102.

In this embodiment, any immediately-adjacent two of the plural grooves are intersected at a corner of the wave-length conversion fluorescent layer. For example, the immediately-adjacent concave groove 106b and concave groove 106c are intersected at a corner 104e of the wave-length conversion fluorescent layer 104.

In this embodiment, any opposite two of the plural grooves are in parallel with each other. For example, the concave groove 106a and the concave groove 106b are opposite to and in parallel with each other across the wave-length conversion fluorescent layer 104, and the concave groove 106c and the concave groove 106d also have the same configuration.

The concave groove between the wave-length conversion fluorescent layer 104 and the light-reflective layer 102 is configured to deal with the negative effects of CTE differences between the wave-length conversion fluorescent layer 104 and the light-reflective layer 102, thereby improving luminous efficacy and weather resistance.

Figure 2:
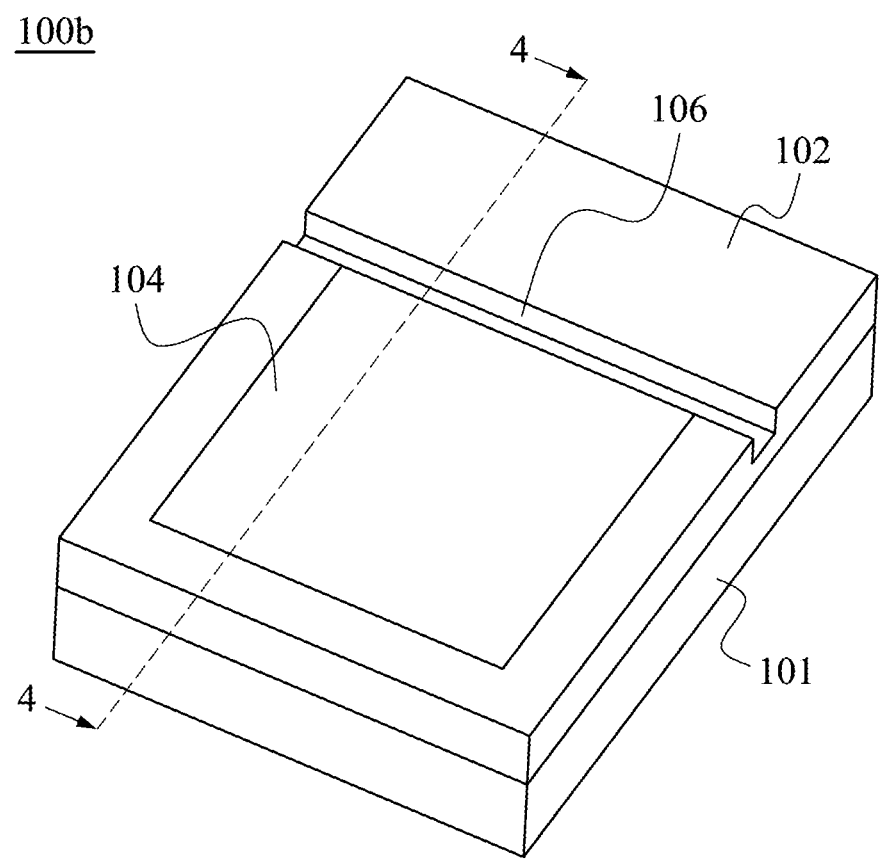
FIG. 2 illustrates a perspective view of a light-emitting diode package according to another embodiment of the present disclosure.

Reference is made to FIG. 2, which illustrates a perspective view of a light-emitting diode package according to one embodiment of the present disclosure. The light-emitting diode package 100b is different from the light-emitting diode package 100a in quantity of the concave groove. In particular, a single concave groove 106 is formed between an edge of the wave-length conversion fluorescent layer 104 and the light-reflective layer 102. In some cases, the single one concave groove 106 between the wave-length conversion fluorescent layer 104 and the light-reflective layer 102 may be form a preferred configuration for a certain CTE difference between the wave-length conversion fluorescent layer 104 and the light-reflective layer 102 so as to achieve a luminous efficacy and weather resistance.

In other embodiments (not illustrated in the drawings), the light-emitting diode package may has two or three concave grooves between its wave-length conversion fluorescent layer and light-reflective layer so as to improve luminous efficacy and weather resistance.

Figure 3:
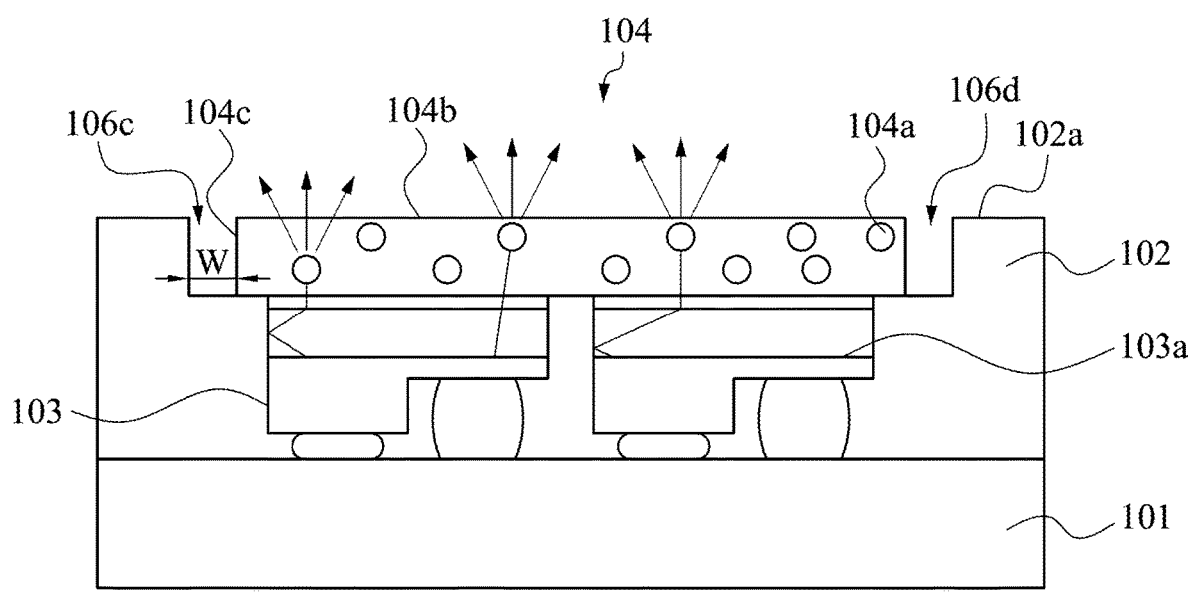
FIG. 3 illustrates a cross-sectional view of the light-emitting diode package in FIG. 1.

Reference is made to FIG. 3, which illustrates a cross-sectional view of the light-emitting diode package in FIG. 1. In this embodiment, the light-emitting diode package 100a may has two light-emitting chips 103 that are surrounded by the light-reflective layer 102, and its wave-length conversion fluorescent layer 104 is coated over tops of the light-emitting chips 103. The light-emitting diode package 100a may be equipped with three or more light-emitting chips, other than two light-emitting chips. The wave-length conversion fluorescent layer 104 has phosphor powders 104a, which are excited by the light emitted from the quantum well light-emitting layer 103a of the light-emitting chip 103 to generate light of different wavelengths.

In this embodiment, the light-emitting chip 103 may be electrically coupled to the substrate 101 by a flip-chip manner, i.e., two electrodes of the light-emitting chip 103 are soldered to corresponding positions of the substrate 101, and no metal wire is required for electrical connection.

In this embodiment, the wave-length conversion fluorescent layer 104 may be a silicone phosphor layer, a glass sintered phosphor layer or a ceramic phosphor layer, but not being limited thereto.

In this embodiment, a top or topmost surface of the wave-length conversion fluorescent layer 104, e.g., the top emitting surface 104b may be level or aligned with a top or topmost surface 102a of the light-reflective layer 102, but not being limited thereto.

In this embodiment, the substrate 101 may be ceramic based substrate, a bismaleimide triazine resin based substrate, a thermosetting epoxy resin substrate, a sapphire substrate or a metal core printed circuit board, but not being limited thereto.

In this embodiment, a concave groove between the wave-length conversion fluorescent layer 104 and the light-reflective layer 102 may enable the LED package to have an additional side emitting surface 104c in addition to the top emitting surface 104b of the wave-length conversion fluorescent layer 104.

In this embodiment, the concave groove may have a width (W) ranging from about 0.05 millimeter to about 0.5 millimeter, but not being limited thereto. In case the width (W) of the concave groove is in the range from 0.05 millimeter to 0.5 millimeter, the wave-length conversion fluorescent layer 104 equipped with both the top emitting surface 104b and the additional side emitting surface 104c would have a similar light-emitting profile as that of the wave-length conversion fluorescent layer 104 equipped with the top emitting surface 104b only. That is, when the width (W) of the concave groove is greater than 0.5 millimeter, the wave-length conversion fluorescent layer 104 equipped with both the top emitting surface 104b and the additional side emitting surface 104c would have a different light-emitting profile from that of the wave-length conversion fluorescent layer 104 equipped with the top emitting surface 104b only. In case the width (W) of the concave groove is smaller than 0.05 millimeter, the width is too small to serve a buffer space for the CTE difference between the wave-length conversion fluorescent layer 104 and the light-reflective layer 102. The concave groove may be formed by laser blasting or knife cutting the substrate, etc., but not being limited thereto.

In this embodiment, the light-reflective layer 102 may be made from white opaque materials, but not being limited thereto.

Figure 4:
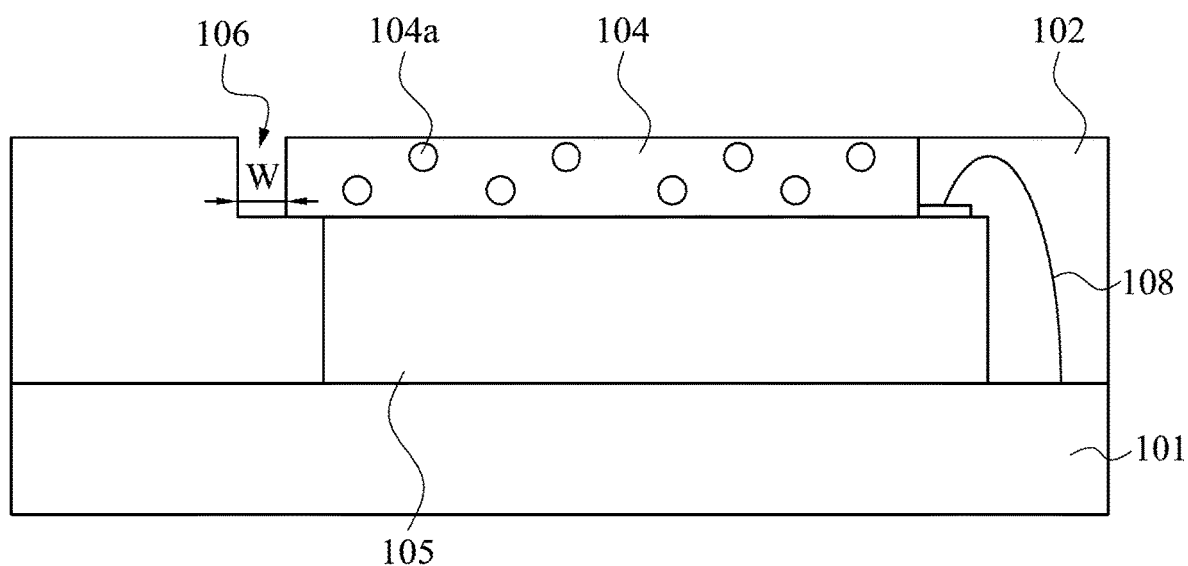
FIG. 4 illustrates a cross-sectional view of the light-emitting diode package in FIG. 2.

Reference is made to FIG. 4, which illustrates a cross-sectional view of the light-emitting diode package in FIG. 2. The light-emitting diode package 100b is also different from the light-emitting diode package 100a in the electrical connection between the light-emitting chip and the substrate. In particular, the light-emitting chip 105 is electrically coupled to the substrate 101 by the flip-chip manner. One electrode of the light-emitting chip 105 is electrically coupled to the substrate 101 via a metal wire 108 that is embedded or buried in the light-reflective layer 102. In this embodiment, a concave groove may not be formed adjacent to the edge of the wave-length conversion fluorescent layer 104 where the metal wire 108 is attached to an electrode of the light-emitting chip 105 to avoid damages upon the metal wire 108 or associated electrode.

In sum, the light-emitting diode package of the present invention utilizes a concave groove between the wave-length conversion fluorescent layer and the light-reflective layer to serve a buffer space for the CTE difference between the wave-length conversion fluorescent layer and the light-reflective layer such that these two layers will not squeeze each other to cause damages to the package structure. A width of the concave groove may be controlled according to demands without affecting the light-emitting profile so as to simultaneously improve the luminous efficacy and weather resistance.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light-emitting diode package comprising:
a substrate;
at least one light-emitting chip disposed on the substrate;
a light-reflective layer disposed around the light-emitting chip; and
a wave-length conversion fluorescent layer disposed over the light-emitting chip, wherein the light-reflective layer is spaced from the fluorescent wave-length conversion layer by at least one groove of which the light-reflective layer and the fluorescent wave-length coversion layer define two opposite sidewalls, the at least one groove reaches two opposite sides of the light-emitting diode package.

2. The light-emitting diode package of claim 1, wherein a thermal expansion coefficient of the light-reflective layer is different from that of the wave-length conversion fluorescent layer.

3. The light-emitting diode package of claim 1, wherein the groove has a width ranging from 0.05 millimeter to 0.5 millimeter.

4. The light-emitting diode package of claim 1, wherein the at least one groove comprises plural grooves formed between each edge of the wave-length conversion fluorescent layer and the light-reflective layer respectively.

5. The light-emitting diode package of claim 4, wherein any immediately-adjacent two of the plural grooves are intersected.

6. The light-emitting diode package of claim 4, wherein any opposite two of the plural grooves are in parallel with each other.

7. The light-emitting diode package of claim 1, wherein the at least one light-emitting chip is electrically coupled to the substrate by a flip-chip manner.

8. The light-emitting diode package of claim 1, wherein a top surface of the wave-length conversion fluorescent layer is level with a top surface of the light-reflective layer.

* * * * *